United States Patent
Oda et al.

(10) Patent No.: US 6,396,208 B1
(45) Date of Patent: May 28, 2002

(54) ORGANIC ELECTROLUMINESCENT DEVICE AND ITS MANUFACTURING PROCESS

(75) Inventors: Atushi Oda; Hitoshi Ishikawa; Satoru Toguchi, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/238,064

(22) Filed: Jan. 27, 1999

(30) Foreign Application Priority Data

Jan. 27, 1998 (JP) .......................................... 10-014183
Jan. 27, 1998 (JP) .......................................... 10-014184

(51) Int. Cl.⁷ .............................. H01J 1/62; H01J 63/04
(52) U.S. Cl. ........................ 313/504; 313/506; 313/509
(58) Field of Search ................................ 313/504, 506, 313/509, 503, 498

(56) References Cited

U.S. PATENT DOCUMENTS 5,247,226 A * 9/1993 Sato et al. .................. 313/504
5,910,706 A * 6/1999 Stevens et al. ............. 313/498
6,023,073 A * 2/2000 Strite .......................... 257/40
6,068,940 A * 5/2000 Tanaka ....................... 428/690

FOREIGN PATENT DOCUMENTS

| JP | 62-172691 | | 7/1987 | |
| JP | 63-314795 | | 12/1988 | |
| JP | 1-220394 | | 9/1989 | |
| JP | 9-129375 | | 5/1997 | |
| JP | 10330743 A | * | 12/1998 | ............ C09K/11/06 |

* cited by examiner

Primary Examiner—Vip Patel
Assistant Examiner—Kevin Quarterman
(74) Attorney, Agent, or Firm—Young & Thompson

(57) ABSTRACT

An organic electroluminescent device in which the electrode in the light-emitting side has small protrusions to allow the counter electrode to have a concave shape so as to utilize reflection by the concave and inclined mirror faces of the counter electrode to improve light-collection efficiency.

18 Claims, 8 Drawing Sheets

ORGANIC ELECTROLUMINESCENT DEVICE AND ITS MANUFACTURING PROCESS

BACKGROUND OF THE INVENTION

1. Field of the Invention

This invention relates to an electroluminescent device with an excellent luminescent efficiency.

2. Description of the Related Art

An organic electroluminescent device (hereinafter we call "organic EL device") is a light-emitting device which makes use of the principle that when an electric field is applied, a fluorescent material emits light in response to the charge recombination of holes injected from an anode and electrons injected from a cathode.

After C. W. Tang et al. of Eastman Kodak Co., reported a low-voltage-driven organic electroluminescent device using a double layered structure. Tang et al. have used tris(8-quinolinol)-aluminum in a light-emitting layer and a triphenyl diamine derivatives in a hole-transporting layer. This stacked structure gives such advantages as an improvement in the injection efficiency of holes into the light-emitting layer; blocking of electrons injected from a cathode, which increase the efficiency of exciton production from charge recombination; and confinement of the excitons into the light-emitting layer. A double layered structure composed of a hole-injecting and transporting layer and an electron-transporting and light-emitting layer or a triple layered structure composed of a hole-injecting and transporting layer, a light-emitting layer and an electron-injecting and transporting layer is well known as an organic EL device. In order to increase the recombination efficiency of injected holes and electrons, various improvements in the device structure or fabrication process have been introduced to such multi-layered devices.

An EL device, however, has a limitation for its luminescent efficiency, since the singlet generation ratio caused by carrier recombination has a dependence on spin statistics of carriers. In organic EL device, a light which is emitted with larger outgoing angle than critical angle is totally reflected caused by the refractive index of the light emitting layer and cannot go out from the layer, light emitting layer to be 1.6, it may utilize only about 20% of the total emission. Combining with generation ratio as above, the total energy conversion efficiency may be limited to a low value, up to about 5% (Tetsuo Tsutsui, "Current conditions and trends in an organic electroluminescence", Display(monthly), Vol. 1(No. 3), p. 11, September 1995) . Because of strong limitation of luminescent efficiency in organic EL device, the poor optical coupling efficiency from the light emitting layer to outside result in fatally lowered total efficiency.

There have been various attempts to improve the efficiency of optical coupling from the light emitting layer to outside for a light emitting device which have an equivalent structure to an organic EL device such as an inorganic EL device. For example, there have been procedures such as improving the efficiency by forming or attaching light convergent optics on a substrate as described in JP-A 63-314795 and forming a reflecting surface, e.g., on the side face of a device as described in JP-A 1-220394. These procedures are effective for a device which have a larger emission area. However, in a device with a smaller pixel area for, e.g., a dot matrix display, it may be difficult to form a lens for light convergence or a reflecting surface on a side face. Furthermore, because EL device has a thin make tapered structure for forming a reflecting mirror on a side face of the device and result in that a layer with an intermediate refractive index is placed as an antireflection film between a glass substrate and luminescent layer in JP-A 62-172691. This procedure may, however, improve a forward optical coupling efficiency, but not prevent total reflection. Thus, it may be effective for an inorganic EL device which has a larger refractive index, but not very effective for an organic EL device whose emitting layer is a relatively lower refractive index.

As described above there have been no satisfactory optical coupling methods EL device. Thus, developing such a efficient optical coupling methods is essential for improving in a total efficiency of an organic EL device.

SUMMARY OF THE INVENTION

An objective of this invention is to improve a optical coupling efficiency in an organic EL device and to provide an organic EL device with a high efficiency.

To solve the problems, this invention provides an organic EL device having one or more than one organic thin layers one of the electrode has a concave shape to the luminescent layer. In this invention, the above problems can be solved by forming the structure that either the anode or the cathode has a concave shape to the luminescent layer. Such a structure may be provided by forming a plurality of small protrusions on the counter electrode.

For example, small protrusions formed on the surface of an electrode 2 as illustrated in FIG. 3 may allow readily providing a counter electrode 6 with a concave shape to a luminescent layer. The process will be described with referring to FIG. 1. An organic film 5 including a luminescent layer and a counter electrode 6 are sequentially deposited on an insulating layer 4 covering an electrode 2 on which a plurality of small protrusions 3 have been formed, resulting in concave parts on the organic film 5 and the counter electrode 6 corresponding to the small protrusions 3. Thus, a concave may be formed on the counter electrode 6 as a consequence of deposition.

As described above, the organic EL device of this invention has a concave electrode. A light generated in the organic film 5 including a luminescent layer is, therefore, reflected by the interface between the organic film 5 and the counter electrode 6, and then focused to the substrate 1 by a concave-mirror effect. Specifically, the light emitted from the area between these electrodes is reflected to a transverse direction to the substrate. Therefore, the light, which cannot be going out to the substrate would be coming out from substrate and the efficiency of optical coupling is remarkably improved. Since an emission area is relatively reduced and a forward reflection efficiency is not 100%, there is possibly to enhance luminance compared with a device having electrodes without small protrusions operating at the same voltage. Since reduction of an emission area may, however, reduce a power consumption, it leads to an overall high efficiency.

The small protrusions in the device of this invention are provided for endowing the counter electrode with a concave shape as described above. They may, therefore, have any shape as long as it provides such an effect; for example, a cylindrical, conical, truncated-cone, quadrangular-pyramid, truncated-pyramid, any cone, cone-pyramid, hemisphere or hemi-ellipsoid shape.

This invention also provides a process for manufacturing an organic EL device, comprising the steps of forming the first electrode layer on a substrate surface; forming a plurality of small protrusions on the first electrode layer; and sequentially forming one or more than one organic layers.

At first, after a flat electrode is formed as a base layer, on which an insulating layer with holes is then formed. Next is deposited into the holes to form small protrusions. In other cases, it may be possible to form a protrusion at each intersection in a grid patterned conductive electrode and the light outgoing from interstitial areas.

This invention further provides an organic EL device having one or more than one organic layers including a luminescent layer between an anode and a cathode, where either the anode or the cathode has inclined faces. An inclined face is defined as a surface inclined by a given angle from the plane of the substrate.

As illustrated in FIG. 8, a cathode 14 has inclined faces. Then, a light generated in a luminescent layer 13 is reflected by the interface between the luminescent layer 13 and the cathode 14, and then focused to the substrate 11 similar to the light emitted from the area between these electrodes which has a direction of totally reflected on the substrate surface or a parallel to the substrate surface may be reflected to a transverse direction to the substrate. Therefore, the light, which cannot be going out to the substrate would be coming out from substrate and the efficiency of optical coupling is remarkably improved since an emission area is relatively reduced and a forward reflection efficiency is not 100%, there is possibly to enhance compared with a device having electrodes without small protrusions operating at the same voltage. Since reduction an emission area may, however, reduce a power consumption, it lead to an overall high efficiency.

In this invention, it is preferable that a plurality of holes are formed on the counter electrode to the above electrode having inclined faces.

Thus, a counter electrode having inclined faces to a luminescent layer may be readily formed. The process will be described with referring to FIG. 7. A luminescent layer 13 and a counter electrode 14 are sequentially formed on an electrode 12 having a plurality of holes. Then, pits appear on the points on the luminescent layer 13 and the counter electrode 14 corresponding to the holes. In other words, the inclined faces may be formed as a consequence of deposition.

The holes in the device of this invention are provided for endowing the counter electrode with inclined faces as described above. They may, therefore, have any shape as long as it provides such an effect; for example, a stripe geometry such as a square, a rectangle and an oblong, and a circle.

These holes do not form isolation grooves. Specifically, the electrodes form a single pixel, and are not separated by the holes (FIG. 7). In other words, the electrode structure does not form a isolation groove between stripe electrodes like in the dot-matrix display forming horizontal and vertical pixel arrays, but provides small holes as internal structures in these electrodes.

This invention further provides a process for manufacturing an organic EL device, comprising the steps of forming the first electrode layer on a substrate; forming a plurality of holes on the first electrode layer; and sequentially forming one or more than one organic layers including a luminescent layer and the second electrode layer on organic layers. The first electrode layer is one of the pair electrodes positioned in the side of an emission face, while the second electrode layer is the counter electrode to the first electrode. For example, in FIG. 7, the anode 12 and the cathode 14 are the first and the second electrodes, respectively. According to the process, the counter electrode having inclined faces to the luminescent layer may be formed as a consequence of deposition.

A plurality of holes may be formed by, for example, the following procedure. A photo-resist is applied in a predetermined pattern on the surface of the first electrode. Then, a given part of the first electrode is etched off to form a plurality of holes. According to the procedure, a plurality of holes may be readily formed in a desired pattern.

DETAILED DESCRIPTION OF THE PREFERRED EMBODIMENTS

Figure 1:
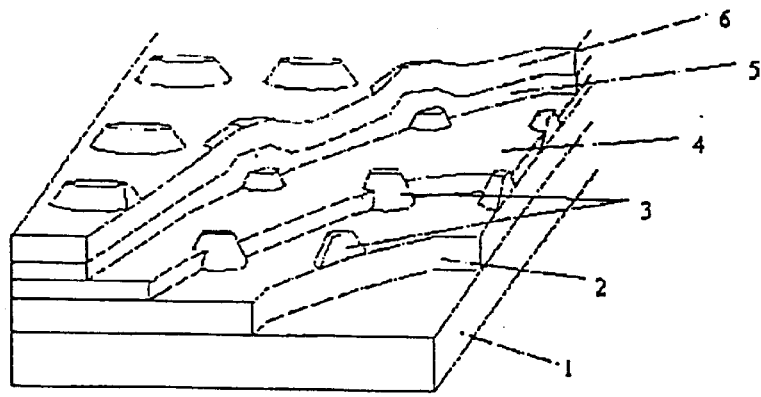
FIG. 1 is a perspective view of an organic EL device according to this invention.
Figure 2:
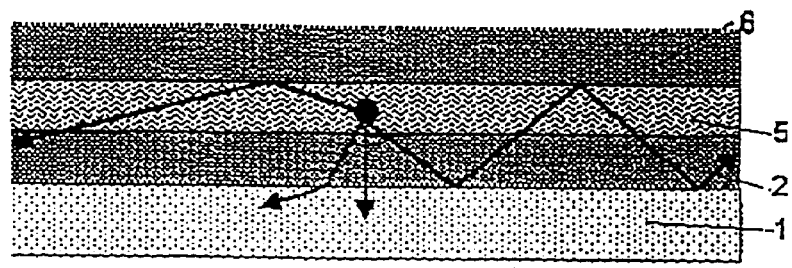
FIG. 2 is a schematic cross-section of an organic EL device according to the prior art.
Figure 3:
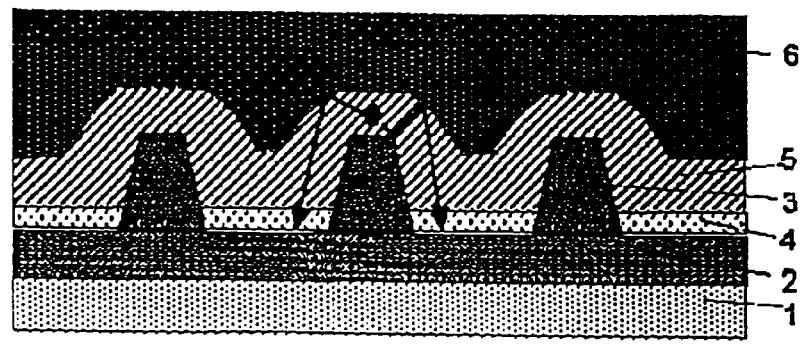
FIG. 3 is a schematic cross-section of the organic EL device according to this invention.

An organic EL device according to this invention has one or more than one organic layers including a luminescent layer between electrodes without limitation. For example, it has a structure consisting of 1) an anode, a luminescent layer and a cathode, 2) an anode, a hole-transporting layer, a luminescent layer, an electron-transporting layer and a cathode, 3) an anode, a hole-transporting layer, a luminescent layer and a cathode, or 4) an anode, a luminescent layer, an electron-transporting layer and a cathode. In addition, between the organic layers and/or between the organic layer and the electrode, a layer consisting of an inorganic dielectric or insulator such as lithium fluoride, magnesium fluoride, silicon oxide, silicon dioxide and silicon nitride; a mixed layer consisting of an organic film and an electrode material or metal; or an organic polymer film consisting of, for example, polyaniline, polyacetylenes, polydiacetylenes, polyvinylcarbazoles and polyparaphenylene vinylenes, may be inserted for improving a charge-injection property, preventing insulation breakdown and/or improving a luminous efficiency.

In this invention, an anode injects positive holes into a hole-transporting layer. It is, therefore, effective for the anode to have a work function at least 4.5 eV. Examples of an anode material used in this invention are, but not limited to, metals or metal oxides such as indium-tin-oxide alloy (ITO), tin-oxide(NESA), gold, silver, platinum and copper, and mixtures thereof. Since a cathode injects electrons into an electron-transporting or luminescent layer, it preferably has a lower work function. Examples of a cathode material are, but not limited to, indium, aluminum, magnesium, magnesium-indium alloy, magnesium-aluminum alloy, aluminum-lithium alloy, aluminum-scandium-lithium alloy and magnesium-silver alloy, and mixtures thereof.

In this invention, the optimal range for the thickness of the organic film (organic luminescent layer) may depend on materials used and its layer structure and be determined in the light of its efficiency and life, while the optimal range for the thickness of the electrode may depend on the thickness of the organic film.

An organic EL device having small protrusions on one electrode will be described.

The electrode having small protrusions may be either an anode or cathode. Either of the electrodes may be transparent or of high reflectance in the visible light region. The thickness of the electrodes are not limited as long as they properly act as an electrode; preferably 0.02 to 2 $\mu$m.

The diameter or the minimum opening distance of the small protrusions is not limited and its optimum range may depend on the thickness of the organic film deposited and the thickness of the electrodes. Since a too large or too small diameter or distance compared with the thickness of the electrodes may reduce the efficiency, the minimum diameter or width of the small protrusions is preferably 0.1 to 10 folds inclusive to the thickness of the electrodes. It may prevent reduction in an efficiency due to increase of the area not involving reflection or emission, while improving a optical coupling efficiency by adequately utilizing reflection on the electrode surface. The minimum width of the small protrusions may be preferably 0.03 $\mu$m to 2 $\mu$m inclusive, possibly depending on the electrode size.

In this invention, the ratio of the total area of the bottom faces of the small protrusions to the area of the electrode having the protrusions is preferably 5% to 50% inclusive. It may prevent reduction in an efficiency due to increase of the area not involving reflection or emission, while improving a optical coupling efficiency.

In this invention, the minimum width of the small protrusions is preferably 0.1 to 5 folds inclusive to the thickness of the organic film. It may prevent reduction in an efficiency due to increase of the area not involving reflection or emission, while adequately utilizing reflection on the electrode face to improve a optical coupling efficiency.

In this invention, the thickness of the electrode having the small protrusions is preferably 0.3 to 5 folds inclusive to the thickness of the organic film. If it is less than 0.3 folds, reflection on the concave face may be inadequate, resulting in reduction in an efficiency. If it is more than 5 folds, the area involving emission may be reduced, resulting in reduction in an efficiency.

Figure 4:
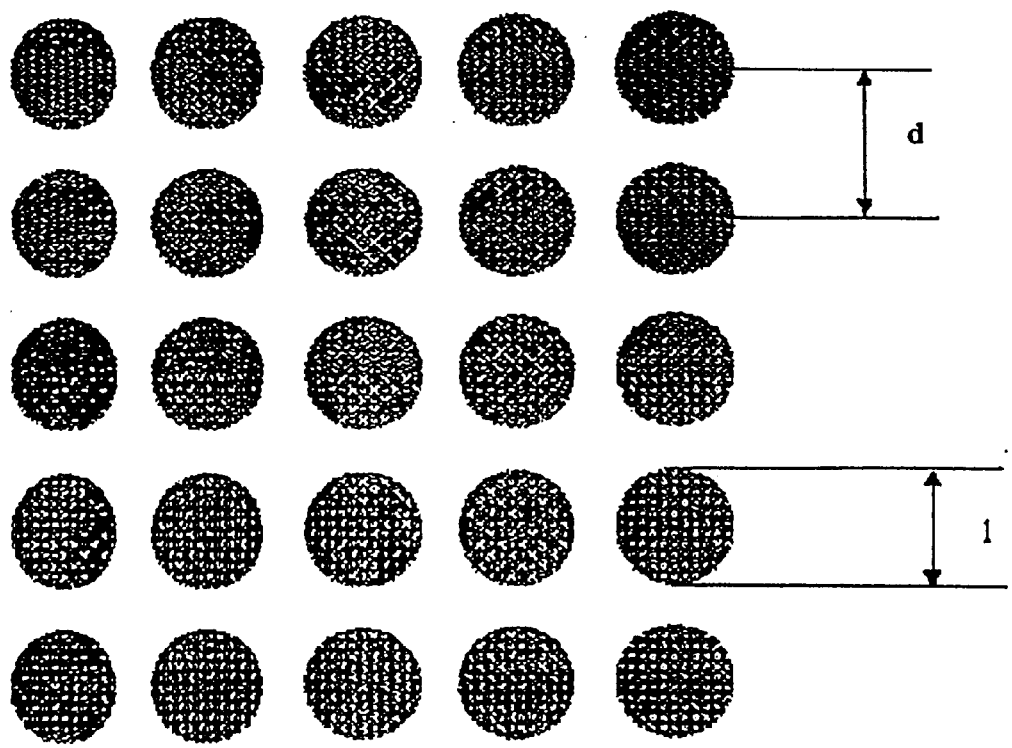
FIG. 4 is a schematic view of the electrode pattern used in Examples 1 to 20.
Figure 6:
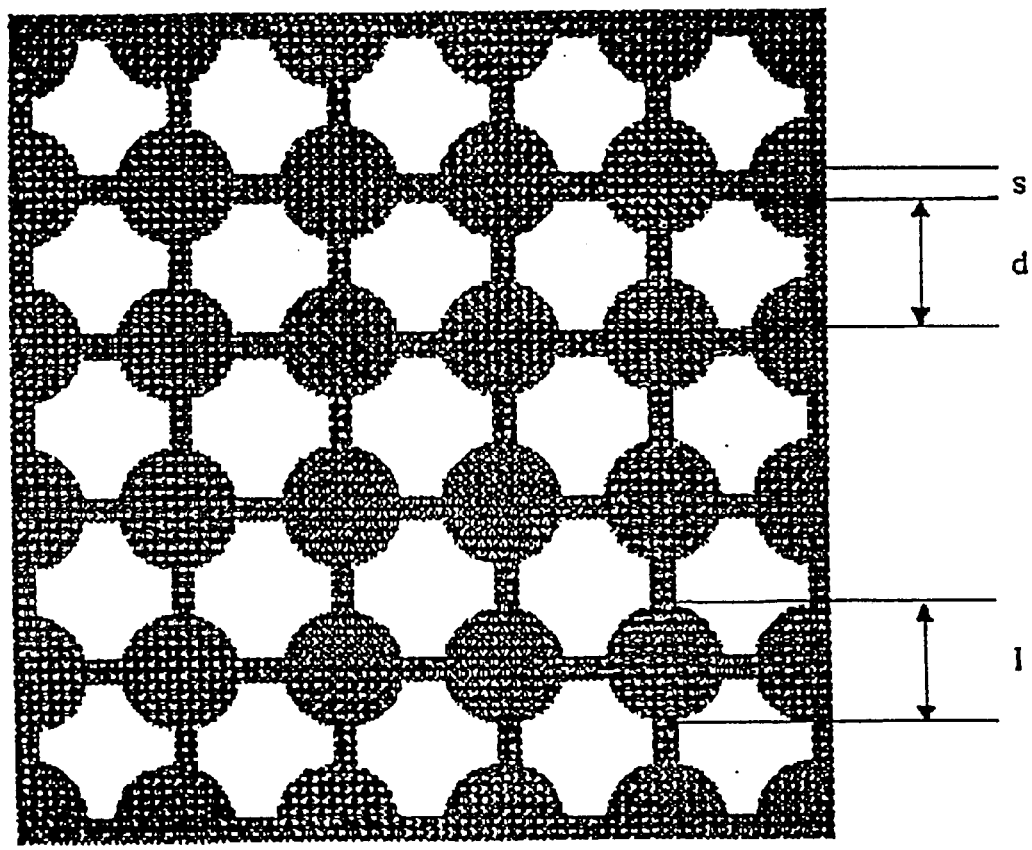
FIG. 6 is a schematic view of the electrode pattern used in Example 21.
Figure 7:
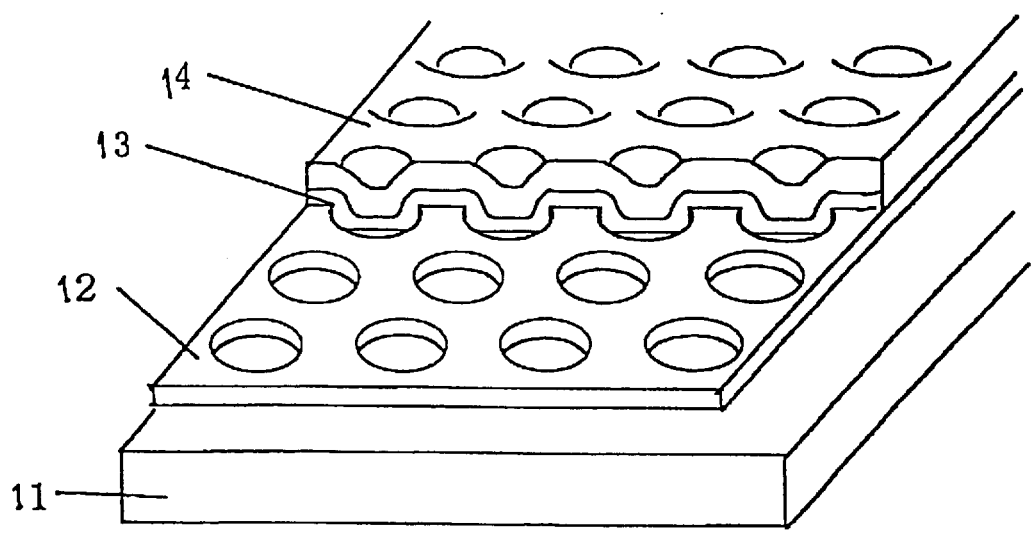
FIG. 7 is a perspective view of another organic EL device according to this invention.
Figure 8:
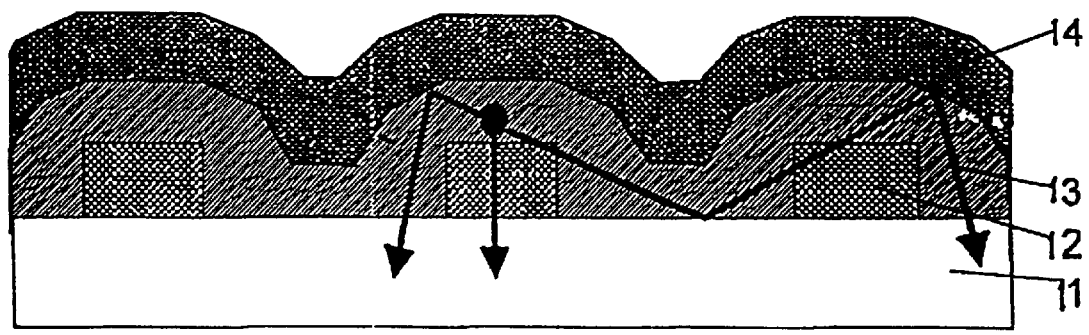
FIG. 8 is a schematic cross-section of the organic EL device according to this invention.

In this invention, a layout for the small protrusions is not limited, and may be periodic or totally irregular. However, if a plurality of small protrusions are regularly aligned on a plane as illustrated in FIGS. 4 and 6, such a two-dimensional regularity may minimize anisotropy due to a one-dimensional periodicity.

The efficiency may be higher when the electrode having the small protrusions has a higher optical reflectance in the visible light region; a practically required reflectance may be 30% or higher.

The small protrusions in this invention are preferably composed of a conductive material opaque to visible light. Visible light has a wavelength of 350 to 800 nm. The term "opaque" indicates that substantially no visible light can penetrate.

The electrode having the small protrusions preferably has a transmittance adequate to transmit reflected light from the rear face, and is composed of a conductive material transparent to visible light. The term "transparent" indicates that visible light can transmit as long as it does not adversely affect the functions of the device as a luminescent device.

The organic EL device of this invention may comprise, between the electrode having small protrusions and the above one or more than one organic layers including a luminescent layer, an insulating layer transparent to visible light, through which the small protrusions stuck out. Such a configuration may allow a light transmittance between protrusions and an aperture to be kept large, without affecting the functions of the protrusions as an electrode.

An organic EL device comprising an electrode having a plurality of holes will be described.

Figure 12:
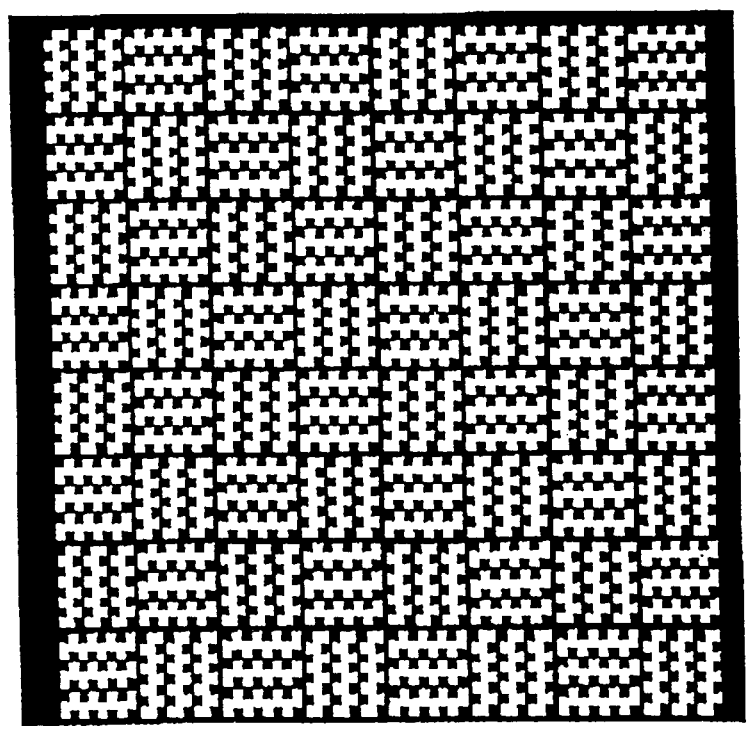
FIG. 12 shows the electrode pattern used in Example 37.
Figure 14:
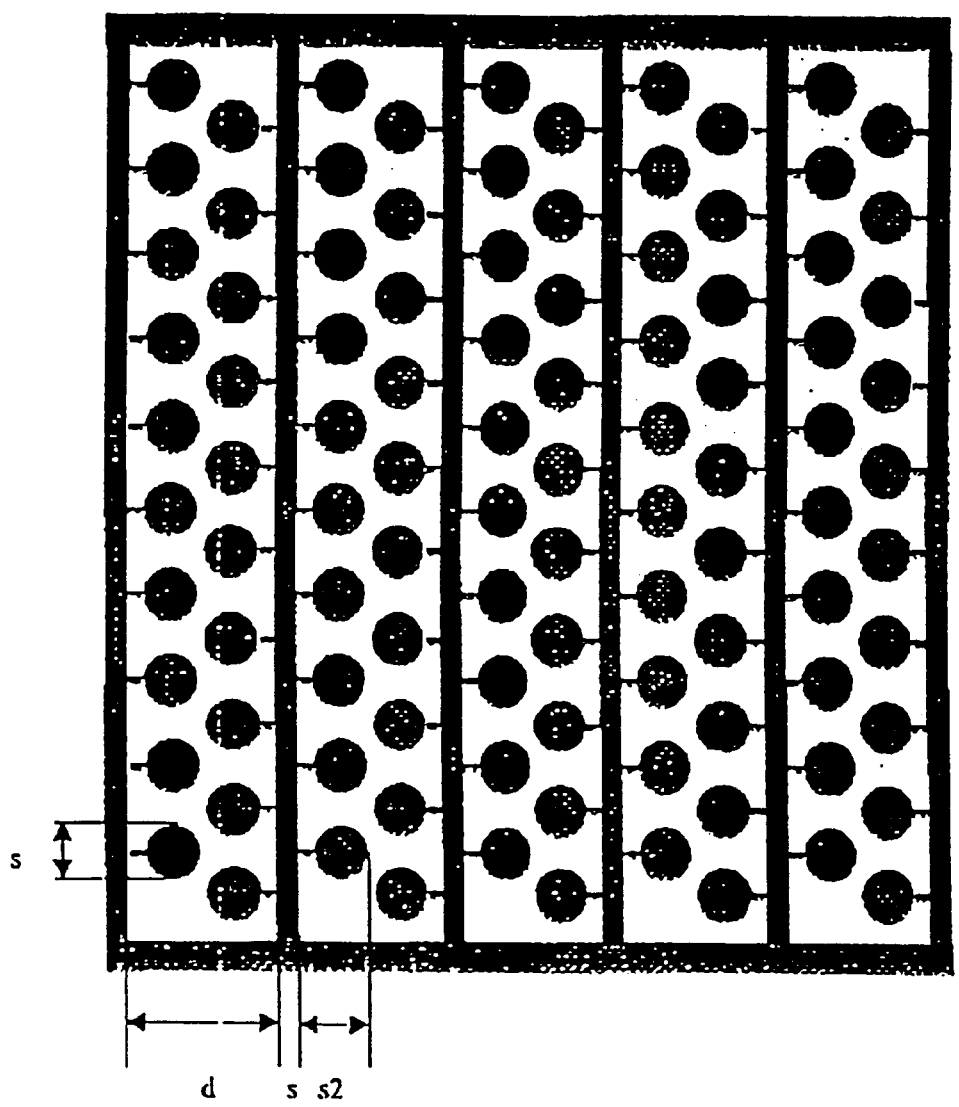
FIG. 14 shows an example of a device where holes are formed, leaving a plurality of island electrodes.

As described above, in this invention, the shape of the hole is not limited. For example, it may be preferably a stripe (FIG. 9) or a comb line (FIG. 12), or preferably configured leaving a plurality of island electrodes as shown in FIG. 14 because it may increase the total length of the edges to the electrode area to more effectively utilize reflection on the inclined faces in the electrode. A stripe includes a square, a rectangle and an oblong as described above. A comb line means that the periphery of the hole has an intricate shape as shown in FIG. 12. The term "leaving a plurality of island electrodes" means forming the holes in a manner that the area surrounding the isolated electrodes are hollowed out as shown in FIG. 14. The shape of the isolated electrodes is not limited, and may be appropriately selected from a variety of shapes such as a circle, an ellipse, a square and a rectangle.

The diameter or the minimum opening distance of the holes is not limited and its optimum range may depend on the thickness of the deposited organic luminescent layer and the thickness of the electrodes. Since a too large or too small diameter or distance compared with the thickness of the electrodes may reduce an efficiency, the minimum diameter or width of the holes is preferably 0.1 to 10 folds inclusive to the thickness of the electrodes. It may prevent reduction in an efficiency due to increase of the area not involving reflection or emission, while improving a optical coupling efficiency by adequate optical reflection. The diameter or the minimum width of the holes may be preferably 0.1 $\mu$m to 2 $\mu$m inclusive, possibly depending on the electrode size.

In this invention, the ratio of the total area of the holes to the area of the whole electrode having the holes is preferably 10% to 85% inclusive. It may prevent reduction in an efficiency due to increase of the area not involving reflection or emission and improve optical coupling efficiency.

In this invention, the diameter or the minimum width of the holes is preferably 0.5 to 10 folds inclusive, more preferably 1 to 5 folds inclusive to the thickness of the organic layers. It may prevent reduction in an efficiency due to increase of the area not involving reflection or emission and provide the electrode with adequate inclined parts. It may prevent reduction in an efficiency due to increase of the area not involving reflection or emission and improve optical coupling efficiency.

In this invention, the thickness of the electrode having the holes is preferably 0.3 to 5 folds inclusive to the thickness of the organic film. If it is less than 0.3 folds, reflection on the concave face may be inadequate and cause to reduction of an efficiency. If it is more than 5 folds, the area involving emission may be reduced and result in reduction of an efficiency.

Figure 9:
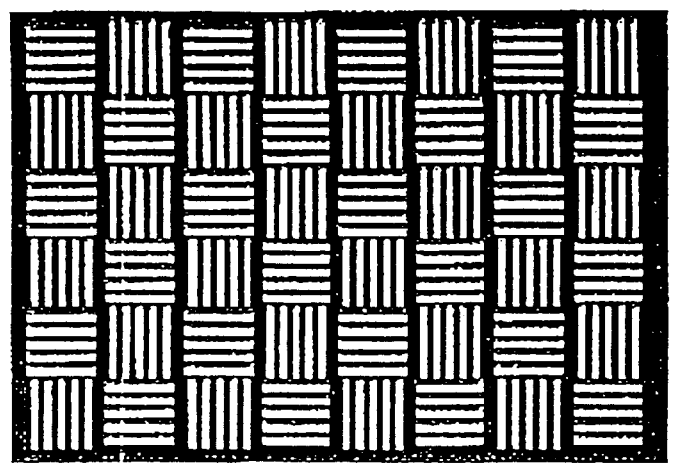
FIG. 9 shows the electrode pattern used in Examples 22 to 34.
Figure 10:
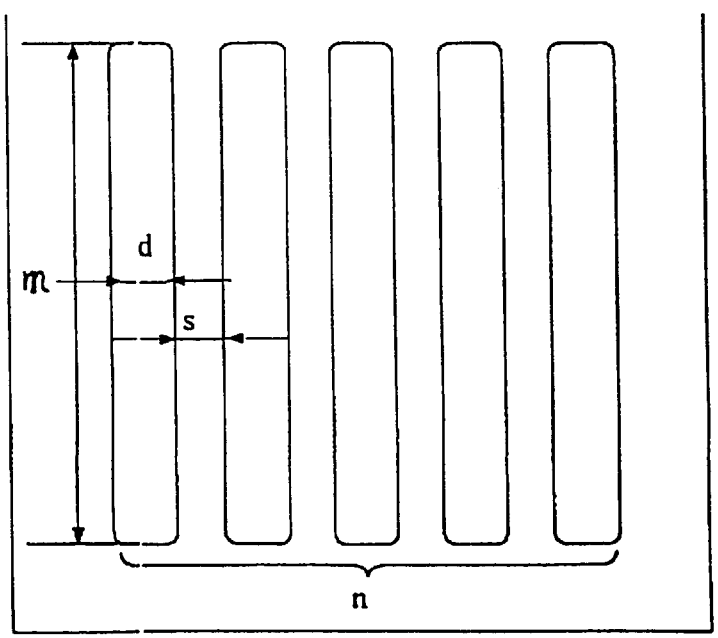
FIG. 10 is an enlarged view of the electrode pattern used in Examples 22 to 34.
Figure 11:
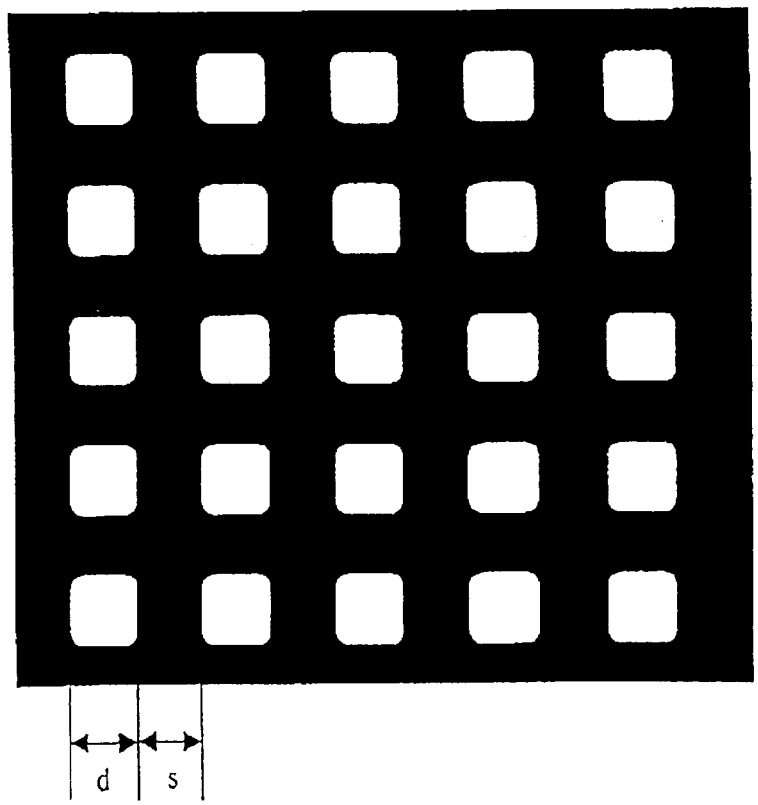
FIG. 11 shows the electrode pattern used in Examples 35 and 36.

In this invention, a layout for the holes is not limited, and may be periodic or totally irregular. However, regularly aligning a plurality of holes on a plane as illustrated in FIG. 9, 11 or 12 may minimize anisotropy in interference.

In this invention, a plurality of holes may be arranged as follows. The electrode having the holes consists of a plurality of base units, in which holes are formed in a given pattern. A hole pattern in one base unit may be rotated by 90° to that in an adjacent base unit. Specifically, a hole pattern in one base unit may be rotated by 90° to be identical to that in an adjacent base unit, as shown in FIGS. 9 and 12. Such an arrangement may minimize anisotropy in an interference effect due to a one-dimensional periodicity.

The efficiency may be higher when the electrode without holes has a higher optical reflectance in the visible light region; a practically required reflectance may be 30% or higher.

There is no limitation for a luminescent material used in this invention, and thus any compound commonly used as a luminescent material may be employed; for example tris(8-quinolinol)-aluminum complex (Alq3) [1], bisdiphenylvinylbiphenyl (BDPVBi) [2], 1,3-bis(p-t-butylphenyl-1,3,4-oxadiazolyl)phenyl (OXD-7) [3], N,N'-bis(2,5-di-t-butylphenyl)perylenetetracarbodiimide (BPPC) [4] and 1,4-bis(N-p-tolyl-N-p-methylstyrylphenyl)aminonaphthalene [5].

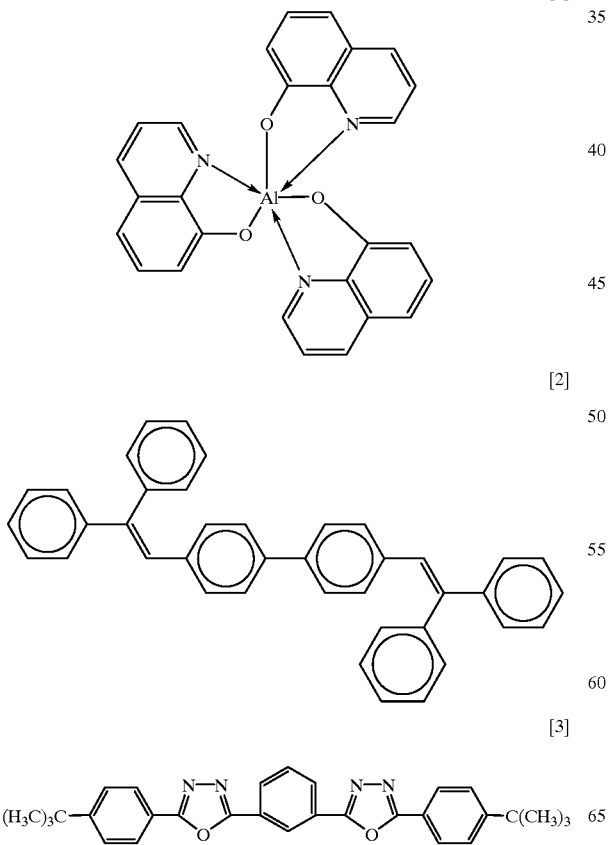

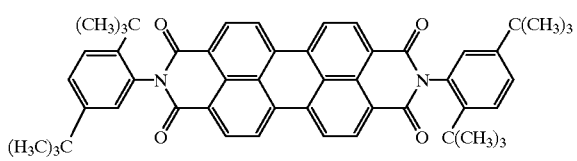

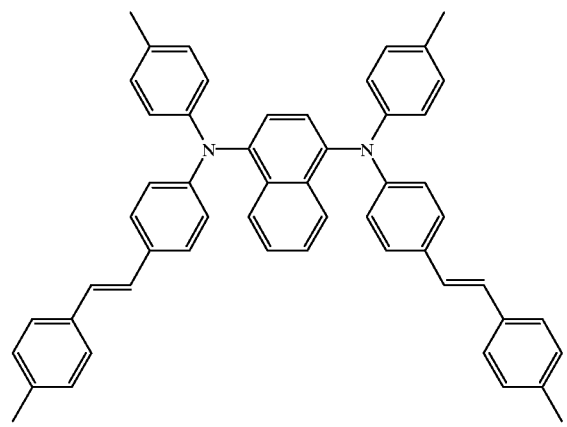

A luminescent layer may consist of a mixture of a charge-transporting material and a luminescent material. Examples include a mixture of a quinolinol-metal complex such as said Alq3 [1] and 4-dicyanomethylene-2-methyl-6-(p-dimethylaminostyryl)-4H-pyrane (DCM) [6], a quinacridone derivertives such as 2,3-quinacridone [7] or a coumarin derivertives such as 3-(2'-benzothiazole)-7-diethylaminocoumarin [8]; a mixture of bis(2-methyl-8-hydroxyquinoline)-4-phenylphenol-aluminum complex [9], commonly used as an electron-transporting material, and a fused polycyclic aromatic compound such as perylene [10]; or a mixture of 4,4'-bis(m-tolylphenylamino)biphenyl (TPD) [11], commonly used as a hole-transport material, and rubrene [12].

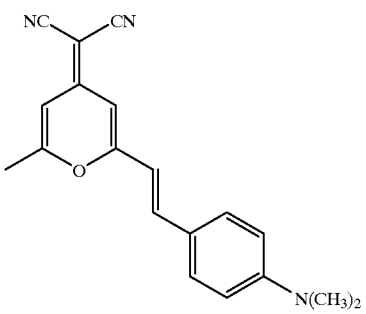

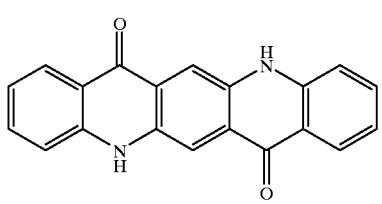

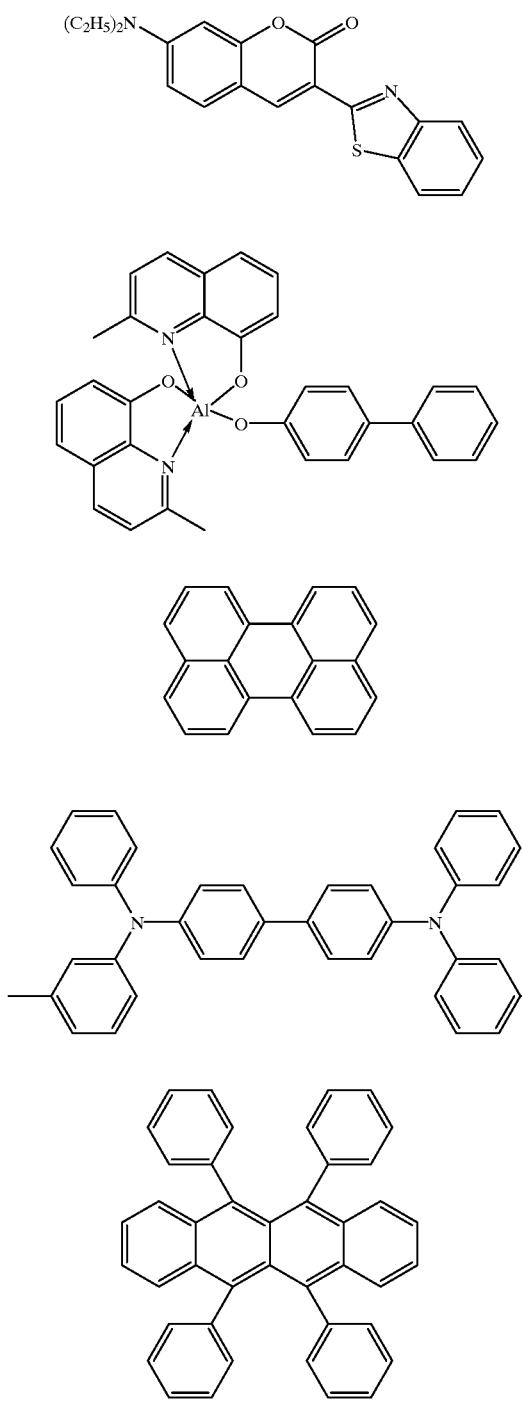
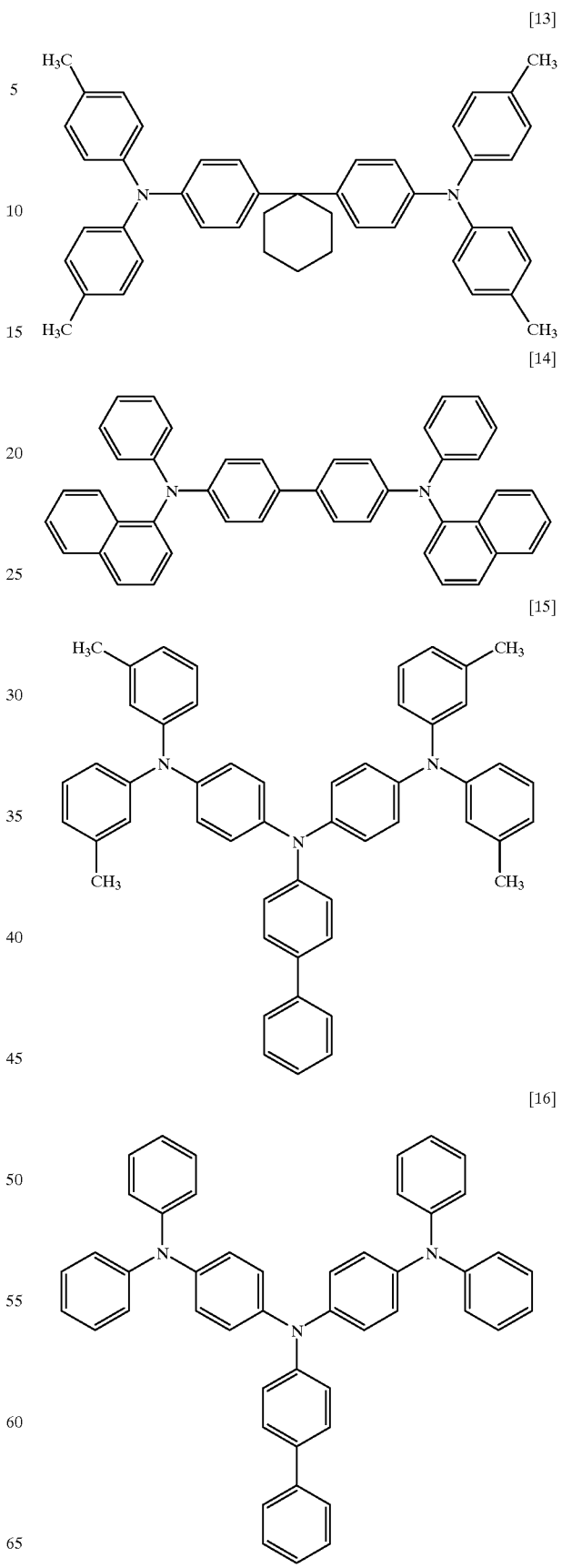
There is no limitation for a hole-transporting material used in this invention, and thus any compound commonly used as a hole-transporting material may be employed. Examples include triphenyldiamines such as bis(di(p-tolyl)aminophenyl)-1,1-cyclohexane [13], TPD [11] and N,N'-diphenyl-N,N'-bis(1-naphthyl)-1,1'-biphenyl)-4,4'-diamine (NPB) [14] and star-burst type molecules (e.g., [15] to [17]).

[17]

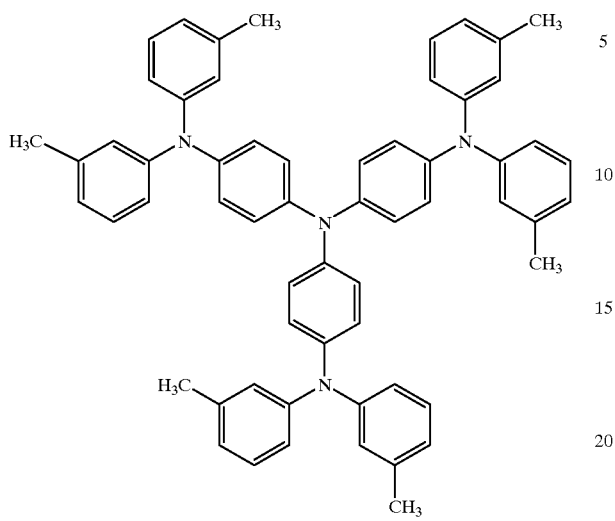

[21]

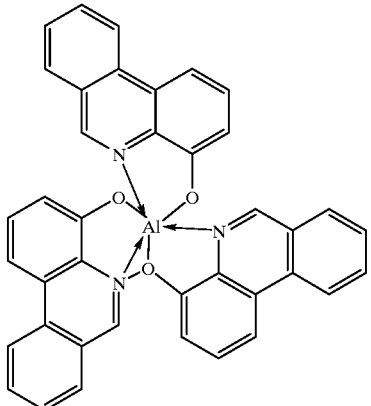

There is no limitation for an electron-transporting material used in this invention, and thus any compound commonly used as an electron-transporting material may be employed. Examples include oxadiazoles such as 2-(4-biphenylyl)-5-(4-t-butylphenyl)-1,3,4-oxadiazole (Bu-PBD) [18] and OXD-7 [3]; triazoles (e.g., [19], [20]); and quinolinol-metal complexes (e.g., [1], [9], [21] to [24]).

[18]

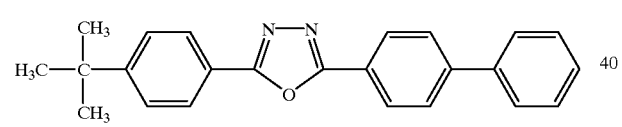

[22]

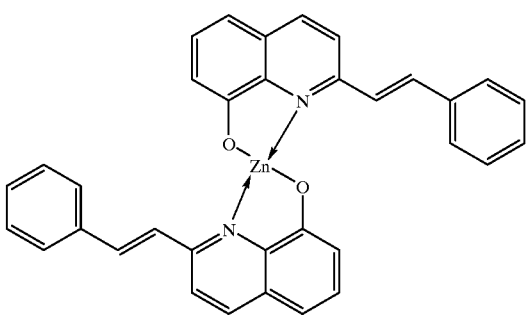

[19]

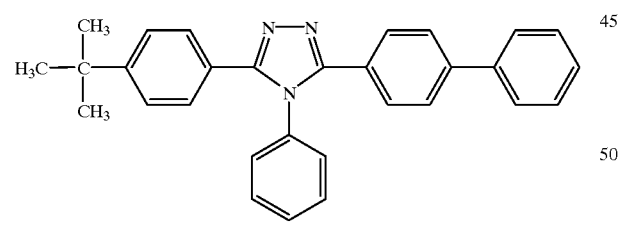

[23]

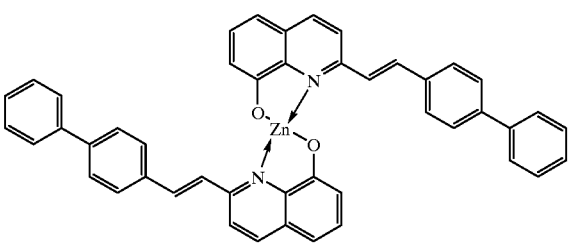

[20]

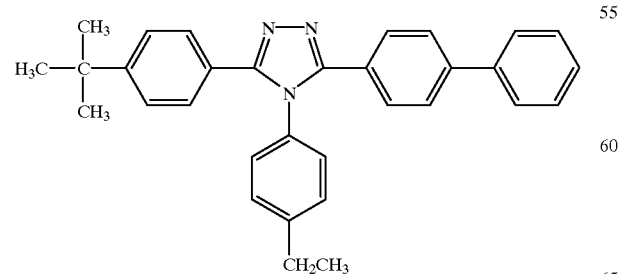

[24]

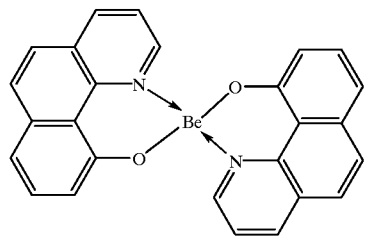

There is no particular limitation imposed on the forming method of each layer of the organic EL device according to the present invention conventionally known methods such as vacuum deposition and spin coating can be employed. The organic thin-film layer which is to be used in the organic EL device of the present invention and contains the said compounds can be formed by the vacuum deposition, molecular beam epitaxy (MBE) or coating of a solution, which has been obtained by dissolving the compound or a mixture of the compound in a proper solvent, by a known coating method such as dipping, spin coating, casting, bar coating or roll coating. There is no limitation for a thickness of each organic layer of the organic electroluminescent device of this invention; preferably, several tens nanometers to 1 μm.

EXAMPLES

This invention will be specifically described with the following examples, but is not limited to the examples without departing from its spirit and scope.

Example 1

A process for fabricating an organic EL device according to this invention will be described. The device has a structure of an anode/gold protrusions/a hole-injection layer/a luminescent layer/an electron-transporting layer/a cathode. On a 50×25 mm glass substrate (HOYA, NA45, 1.1 mm in thickness), an ITO layer of 120 nm thickness was patterned as a 2 mm×50 mm strip by spattering×50 mm strip using a metal mask. Its sheet resistance was 18 Ω/□.

On the ITO layer, an electrode having gold protrusions shown in FIG. 1 was formed Using photolithographic technique. The process will be described bellow.

An insulating layer 4 of $TiO_2$ with 50 nm thickness was deposited by spattering on the glass substrate. Photoresist (Tokyo Ohka, THMR-iP 1700) was applied and 2 μm thickness film was formed by spin coating. The photoresist film was patterned with a plurality of circular openings as shown in FIG. 4, using an i-line stepper, where l=0.6 μm and d=1.4 μm.

Then, the $TiO_2$ film which was not covered with the photoresist was etched off with reactive ion etching using a mixed gas of methane and hydrogen.

Without removing the photoresist, gold thin film was vacuum-deposited using a resistance-heating. The substrate was placed in the upper part of a vacuum chamber and a molybdenum boat was placed 250 mm under the substrate. An incident angle was adjusted to 38° to the substrate, which was rotated at 20 rpm. After the pressure reached $5 \times 10^{-7}$ Torr, vacuum deposition was initiated while controlling a deposition rate with a crystal oscillator type of film-thickness controller placed on the side of the substrate. The evaporated gold film had a thickness of 400 nm measured by the crystal oscillator type of film-thickness meter.

After depositing gold, the remaining photoresist was removed with an exclusive remover liquid to form a gold electrode having protrusions.

An organic luminescent layer was formed by the above resistance heating vacuum deposition technique. While the substrate was placed in the upper part of a vacuum chamber, a molybdenum boat was placed 250 mm under the substrate. An incident angle was adjusted to 38° to the substrate, which was rotated at 30 rpm. Once the pressure reached $5 \times 10^{-7}$ Torr, vacuum deposition was initiated while controlling a deposition rate with a crystal oscillator type of film-thickness controller placed on the side of the substrate. The deposition rate was set to 0.15 nm per second. Under the above conditions, the compound represented by formula [15] was deposited as a hole-injection layer in the thickness of 40 nm. Then, the compounds represented by formulas [5] and [19] were sequentially deposited in the thicknesses of 70 nm and 40 nm as a luminescent layer and an electron-transporting layer, respectively, under the same conditions.

Then, a magnesium-silver alloy layer was formed as a cathode by simultaneously vacuum-depositing these metals from separate boats, while controlling the deposition rates of magnesium and silver to 1.0 nm and 0.2 nm per second, respectively. The thickness was 200 nm. Using a metal mask during deposition, twelve 25 mm×2 mm strip patterns were formed at an interval of 1 mm, crossing perpendicularly to the ITO strip patterns to form a cathode.

Applying 10 V to the device gave a current density of 26.4 mA/cm$^2$ and a luminance of 1588 cd/m$^2$. Thus, efficiencies were estimated to be 6.02 cd/A and 1.89 lm/W.

Comparative Example 1

A process for manufacturing an organic EL device for comparison will be described. The device has a structure of an anode/a hole-injection layer/a luminescent layer/an electron-transporting layer/a cathode. On a 50×25 mm glass substrate (HOYA, NA45, 1.1 mm in thickness) was deposited an ITO layer 120 nm in thickness by spattering, as a 2 mm×50 mm strip using a metal mask. Its sheet resistance was 18 Ω/□.

An organic luminescent layer was formed by a resistance heating vacuum deposition technique. While the substrate was placed in the upper part of a vacuum chamber, a molybdenum boat was placed 250 mm under the substrate. An incident angle was adjusted to 38° to the substrate, which was rotated at 30 rpm. Once the pressure reached $5 \times 10^{-7}$ Torr, vacuum deposition was initiated while controlling a deposition rate with a crystal oscillator type of film-thickness controller placed on the side of the substrate. The deposition rate was set to 0.15 nm per second. Under the above conditions, the compound represented by formula [15] was deposited as a hole-injection layer in the thickness of 40 nm. Then, the compounds represented by formulas [5] and [19] were sequentially deposited in the thicknesses of 70 nm and 40 nm as a luminescent layer and an electron-transporting layer, respectively, under the same conditions.

Then, a magnesium-silver alloy layer was formed as a cathode by simultaneously vacuum-depositing these metals from separate boats, while controlling the deposition rates of magnesium and silver to 1.0 nm and 0.2 nm per second, respectively. The thickness was 200 nm. Using a metal mask during deposition, twelve 25 mm×2 mm strip patterns were formed at an interval of 1 mm, crossing perpendicularly to the ITO strip patterns to form a cathode.

Applying 10 V to the device gave a current density of 50 mA/cm$^2$ and a luminance of 1950 cd/m$^2$. Thus, efficiencies were estimated to be 3.9 cd/A and 1.22 lm/W.

Examples 2 to 10

In these Examples, a device was prepared as described in Example 1 except for varying l, d and a thickness of gold protrusions shown in Table 1. The measured properties are shown in Table 2.

TABLE 1

| Example No. | Diameter (l) (μm) | Interval (d) (μm) | Thickness of gold (μm) |
|---|---|---|---|
| 2 | 0.60 | 1.00 | 0.40 |
| 3 | 0.60 | 1.40 | 0.40 |
| 4 | 0.40 | 0.80 | 0.40 |
| 5 | 0.40 | 1.00 | 0.40 |
| 6 | 0.40 | 1.40 | 0.40 |
| 7 | 0.40 | 0.80 | 0.20 |
| 8 | 0.40 | 0.80 | 0.30 |
| 9 | 0.40 | 0.80 | 0.50 |
| 10 | 0.40 | 0.80 | 0.60 |

TABLE 2

| Example No. | Current density at 10 V (mA/cm²) | Luminance at 10 V (cd/m²) | Efficiency (cd/A) | Efficiency (lm/W) |
|---|---|---|---|---|
| 2 | 17.6 | 930 | 5.3 | 1.66 |
| 3 | 9.3 | 431 | 4.6 | 1.46 |
| 4 | 12.7 | 851 | 6.7 | 2.10 |
| 5 | 8.2 | 510 | 6.2 | 1.95 |
| 6 | 4.2 | 231 | 5.5 | 1.73 |
| 7 | 9.8 | 497 | 5.1 | 1.59 |
| 8 | 12.7 | 845 | 6.7 | 2.09 |
| 9 | 14.7 | 688 | 4.7 | 1.47 |
| 10 | 14.7 | 635 | 4.3 | 1.36 |

Example 11

A device was prepared as described in Example 1 except that a cathode, an organic film and an anode were sequentially deposited on a substrate. Specifically, protrusions were similarly formed using magnesium-silver alloy instead of gold; the organic film was formed in a reverse order, i.e., an electron-transporting layer/a luminescent layer/a hole-injection layer were sequentially deposited, and finally a gold anode was formed. The pattern dimensions were s=0.4 μm and l=0.8 μm. Applying 10 V to the device gave a current density of 34.2 mA/cm² and a luminance of 1651 cd/m². Thus, efficiencies were estimated to be 4.8 cd/A and 1.52 lm/W.

Examples 12 to 20

In these Examples, a device was prepared as described in Example 1 except for varying l, d and a thickness of magnesium-silver alloy protrusions shown in Table 3. The measured properties are shown in Table 4.

TABLE 3

| Example No. | Diameter (l) (μm) | Interval (d) (μm) | Thickness Thickness (μm) |
|---|---|---|---|
| 12 | 0.60 | 1.00 | 0.40 |
| 13 | 0.60 | 1.40 | 0.40 |
| 14 | 0.40 | 0.80 | 0.40 |
| 15 | 0.40 | 1.00 | 0.40 |
| 16 | 0.40 | 1.40 | 0.40 |
| 17 | 0.40 | 0.80 | 0.20 |
| 18 | 0.40 | 0.80 | 0.30 |
| 19 | 0.40 | 0.80 | 0.50 |
| 20 | 0.40 | 0.80 | 0.60 |

TABLE 4

| Example No. | Current density at 10 V (mA/cm²) | Luminance at 10 V (cd/m²) | Efficiency (cd/A) | Efficiency (lm/W) |
|---|---|---|---|---|
| 12 | 21.5 | 972 | 4.5 | 1.42 |
| 13 | 12.5 | 543 | 4.3 | 1.35 |
| 14 | 14.8 | 891 | 6.0 | 1.89 |
| 15 | 10.7 | 540 | 5.0 | 1.58 |
| 16 | 5.5 | 245 | 4.5 | 1.40 |
| 17 | 11.8 | 478 | 4.1 | 1.27 |
| 18 | 17.8 | 946 | 5.3 | 1.67 |
| 19 | 21.0 | 990 | 4.7 | 1.47 |
| 20 | 22.3 | 955 | 4.3 | 1.36 |

Example 21

Figure 5:
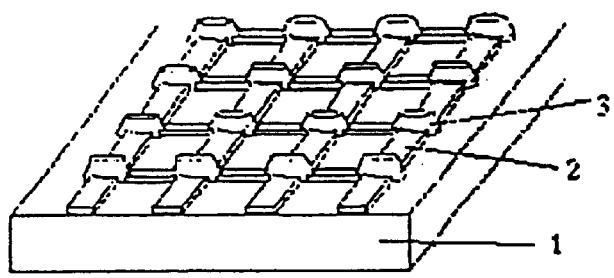
FIG. 5 is a perspective view of the electrode pattern used in Example 21.

As an electrode for conduction between protrusions, a grid electrode as shown in FIG. 5 was used instead of the ITO base layer. The pattern of the grid gold electrode was formed as follows. After depositing gold 0.05 μm thickness on a substrate, circular holes (openings) were formed on the photoresist by photolithography as described in Example 1. Gold protrusions 500 nm in thickness were formed at lattice points by a lift-off technique, on which an organic film and a cathode were then formed as described in Example 1. Dimensions in the symbols shown in FIG. 6 were s=0.35 μm, d=1.0 μm and l=0.6 μm. Applying 10 V to the device gave a current density of 37.5 mA/cm² and a luminance of 1620 cd/m². Thus, efficiencies were estimated to be 4.3 cd/A and 1.361 lm/W.

Example 22

A process for fabricating an organic EL device according to this invention will be described. The device has a structure of an anode/a hole-injection layer/a luminescent layer/an electron-transporting layer/a cathode. On a 50×25 mm glass substrate (HOYA, NA45, 1.1 mm in thickness), an ITO layer of 300 nm thickness was formed by spattering, and patterned with fine stripe as shown in FIG. 9. The fine stripe patterns had dimensions of s=0.6 μm, d=0.6 μm and m=2 μm, and one unit consisted of 15 pairs (i.e., n=15). The patterns were formed over all the ITO surface in a manner that one pattern was aligned, crossing perpendicularly to an adjacent one. The fine stripe patterns were formed by photolithography an i-line photoresist (Tokyo Ohka, THMR-iP 1700) was applied on the ITO to form a photoresist film of 2 μm thickness by spin coating. Then, the exposed part of the ITO was removed with a mixed gas of methane and hydrogen using reactive ion etching. The product was taken from the apparatus and the remaining resist was removed with an exclusive remover to form the fine stripe ITO patterns. The ITO had a sheet resistance of 8 Ω/□.

An organic luminescent layer was formed by a resistance heating vacuum deposition technique. While the substrate was placed in the upper part of a vacuum chamber, a molybdenum boat was placed 250 mm under the substrate. An incident angle was adjusted to 38° to the substrate, which was rotated at 30 rpm. Once the pressure reached 5×10⁻⁷ Torr, vacuum deposition was initiated while controlling a deposition rate with a crystal oscillator type of film-thickness controller placed on the side of the substrate. The deposition rate was set to 0.15 nm per second. Under the above conditions, the compound represented by formula [15] was deposited as a hole-injection layer in the thickness of 40 nm. Then, the compounds represented by formulas [5] and [19] were sequentially deposited in the thicknesses of 70 nm and 40 nm as a luminescent layer and an electron-transporting layer, respectively, under the same conditions. Then, a magnesium-silver alloy layer was formed as a cathode by simultaneously vacuum-depositing these metals from separate boats, while controlling the deposition rates of magnesium and silver to 1.0 nm and 0.2 nm per second, respectively, using the above film-thickness controller. The thickness was 200 nm.

Applying 10 V to the device gave a current density of 35 mA/cm² and a luminance of 2180 cd/m². Thus, efficiencies were estimated to be 6.24 cd/A and 1.96 lm/W.

Comparative Example 2

A process for manufacturing an organic EL device for comparison will be described. The device has a structure of an anode/a hole-injection layer/a luminescent layer/an electron-transporting layer/a cathode. On a 50×25 mm glass substrate (HOYA, NA45, 1.1 mm in thickness), an ITO layer of 300 nm thickness by spattering, as a 2 mm×50 mm strip using a metal mask. Its sheet resistance was 8 Ω/□.

An organic luminescent layer was formed by a resistance heating vacuum deposition technique. While the substrate was placed in the upper part of a vacuum chamber, a molybdenum boat was placed 250 mm under the substrate. An incident angle was adjusted to 38° to the substrate, which was rotated at 30 rpm. Once the pressure reached $5\times10^{-7}$ Torr, vacuum deposition was initiated while controlling a deposition rate with a crystal oscillator type of film-thickness controller placed on the side of the substrate. The deposition rate was set to 0.15 nm per second. Under the above conditions, the compound represented by formula [15] was deposited as a hole-injection layer in the thickness of 40 nm. Then, the compounds represented by formulas [5] and [19] were sequentially deposited in the thicknesses of 70 nm and 40 nm as a luminescent layer and an electron-transporting layer, respectively, under the same conditions.

Then, a magnesium-silver alloy layer was formed as a cathode by simultaneously vacuum-depositing these metals from separate boats, while controlling the deposition rates of magnesium and silver to 1.0 nm and 0.2 nm per second, respectively. The thickness was 200 nm. Using a metal mask during deposition, twelve 25 mm×2 mm strip patterns were formed at an interval of 1 mm, crossing perpendicularly to the ITO strip patterns to form a cathode.

Applying 10 V to the device gave a current density of 50 mA/cm$^2$ and a luminance of 1950 cd/m$^2$. Thus, efficiencies were estimated to be 3.9 cd/A and 1.22 lm/W.

Examples 23 to 34

In these Examples, a device was prepared as described in Example 22 except for varying s, d, n and the thickness of the ITO shown in Table 5. The measured properties are shown in Table 6.

TABLE 5

| Ex. No. | Line width (s) (μm) | Interval (d) (μm) | No. of Pairs (n) | Line length (l) (μm) | ITO thickness (μm) |
|---|---|---|---|---|---|
| 23 | 0.60 | 0.80 | 14 | 20 | 0.30 |
| 24 | 0.60 | 1.40 | 10 | 20 | 0.30 |
| 25 | 0.80 | 0.60 | 14 | 20 | 0.30 |
| 26 | 0.80 | 0.80 | 12 | 20 | 0.30 |
| 27 | 0.80 | 1.40 | 9 | 20 | 0.30 |
| 28 | 1.40 | 1.40 | 7 | 20 | 0.30 |
| 29 | 0.40 | 0.40 | 25 | 20 | 0.40 |
| 30 | 0.40 | 0.40 | 25 | 20 | 0.30 |
| 31 | 0.40 | 0.40 | 25 | 20 | 0.20 |
| 32 | 0.60 | 0.40 | 20 | 20 | 0.40 |
| 33 | 0.60 | 0.40 | 20 | 20 | 0.30 |
| 34 | 0.60 | 0.40 | 20 | 20 | 0.20 |

TABLE 6

| Example No. | Current density at 10 V (mA/cm$^2$) | Luminance at 10 V (cd/m$^2$) | Efficiency (cd/A) | Efficiency (lm/W) |
|---|---|---|---|---|
| 23 | 30.0 | 1852 | 6.2 | 1.94 |
| 24 | 22.5 | 1268 | 5.6 | 1.77 |
| 25 | 39.0 | 2145 | 5.5 | 1.73 |
| 26 | 34.2 | 1848 | 5.4 | 1.70 |
| 27 | 25.0 | 1326 | 5.3 | 1.67 |
| 28 | 30.5 | 1460 | 4.8 | 1.50 |
| 29 | 50.0 | 3200 | 6.4 | 2.01 |
| 30 | 42.3 | 2505 | 5.9 | 1.86 |
| 31 | 31.5 | 1716 | 5.4 | 1.71 |
| 32 | 53.8 | 3462 | 6.4 | 2.02 |
| 33 | 45.0 | 2574 | 5.7 | 1.79 |
| 34 | 34.1 | 1872 | 5.5 | 1.72 |

Example 35

A device was prepared as described in Example 23 except that the grid electrode pattern illustrated in FIG. 11 was used. The dimensions of the pattern were s=0.4 μm and d=0.6 μm. Applying 10 V to the device gave a current density of 33.1 mA/cm$^2$ and a luminance of 2120 cd/m$^2$. Thus, efficiencies were estimated to be 6.04 cd/A and 2.01 lm/W.

Example 36

A device was prepared as described in Example 35 except that gold 0.3 μm in thickness was used as an anode instead of the ITO. The gold electrode was patterned by wet etching with aqua regia. Applying 10 V to the device gave a current density of 27.6 mA/cm$^2$ and a luminance of 1330 cd/m$^2$. Thus, efficiencies were estimated to be 4.8 cd/A and 1.53 lm/W.

Example 37

Figure 13:
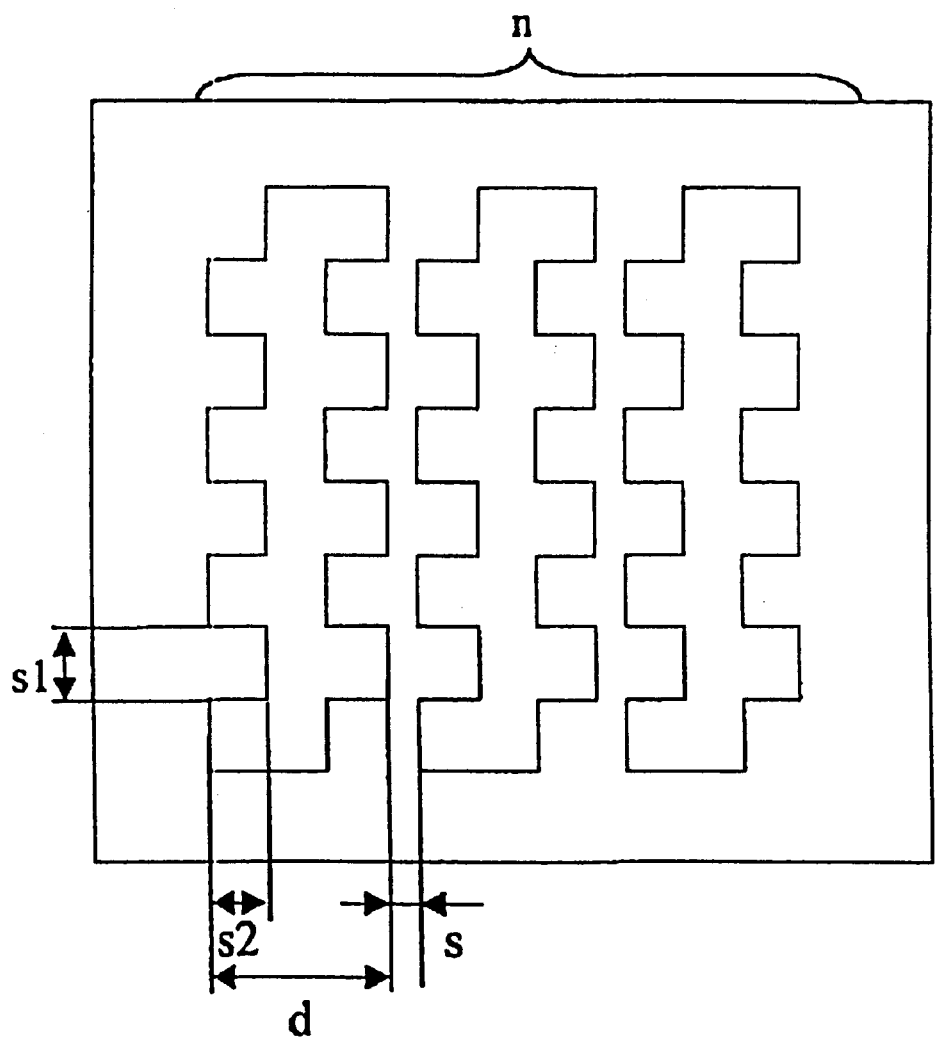
FIG. 13 is an enlarged view of the electrode pattern used in Examples 37.

A device was prepared as described in Example 23 except that the electrode pattern illustrated in FIGS. 12 and 13 was used, where FIG. 13 is an enlarged view of the electrode pattern in FIG. 12. The dimensions of the pattern were s=0.4 μm, d=1.4 μm, s1=0.4 μm and s2=0.4 μm in FIG. 13. Applying 10 V to the device gave a current density of 26.3 mA/cm$^2$ and a luminance of 1729 cd/m$^2$. Thus, efficiencies were estimated to be 6.57 cd/A and 2.06 lm/W.

What is claimed is:

1. An organic electro-luminescent device comprising:
   a light-transparent substrate;
   a first electrode adjacent the light-transparent substrate;
   a second electrode spaced apart from the first electrode;
   one or more organic layers including a luminescent layer located intermediate the first and second electrodes; and
   a plurality of small protrusions formed on the first electrode,
   the second electrode having a concave surface facing the organic layers including the luminescent layer and arranged as a light-reflective surface, and
   wherein a light emitted in the luminescent layer comes out from the light-transparent substrate.

2. An organic electroluminescent device as claimed in claim 1, where the small protrusions have cylindrical shape.

3. An organic electroluminescent device as claimed in claim 1, where the minimum width of the small protrusions is 0.03 μm to 2 μm inclusive.

4. An organic electroluminescent device as claimed in claim 1, where the ratio of the total area of the bottom faces of the small protrusions to the area of the electrode having the protrusions is 5% to 50% inclusive.

5. An organic electroluminescent device as claimed in claim 1, where the minimum width of the small protrusions is 0.1 to 5 folds inclusive to the thickness of the organic film.

6. An organic electroluminescent device as claimed in claim 1, where the small protrusions are composed of a conductive material opaque to visible light.

7. An organic electroluminescent device as claimed in claim 1, where the first electrode having the small protrusions is composed of a conductive material transparent to visible light.

8. An organic electroluminescent device as claimed in claim 1, comprising, between the first electrode having small protrusions and said one or more than one organic layers including a luminescent layer, an insulating layer transparent to visible light, through which the small protrusions stuck out.

9. An organic electro-luminescent device having one or more than one organic layers including a luminescent layer between an anode and a cathode,
   where either the anode or the cathode has an inclined face and the electrode having inclined faces is adapted to act as a light-reflective surface;
   a plurality of holes are formed on the counter electrode to the electrode having inclined faces and the luminescent layer extends into the holes; and
   the counter electrode with the holes are formed on a light-transparent substrate, from which a light emitted in the luminescent layer comes out.

10. An organic electroluminescent device as claimed in claim 9, where the holes has a stripe shape.

11. An organic electroluminescent device as claimed in claim 9, where the holes has a comb-line shape.

12. An organic electroluminescent device as claimed in claim 9, where the holes are formed leaving a plurality of island electrodes.

13. An organic electroluminescent device as claimed in claim 9, where the ratio of the total area of the holes to the area of the electrode having the holes is 10% to 85% inclusive.

14. An organic electroluminescent device as claimed in claim 9, where the diameter or the minimum width of the holes is 0.1 $\mu$m to 2 $\mu$m inclusive.

15. An organic electroluminescent device as claimed in claim 9, where the diameter or the minimum width of the holes is 0.5 to 10 folds inclusive.

16. An organic electroluminescent device as claimed in claim 9, where the thickness of the electrode having the holes is 0.3 to 5 folds inclusive to the thickness of the organic film.

17. An organic electroluminescent device as claimed in claim 9, where the plurality of holes are regularly aligned on a plane.

18. An organic electroluminescent device as claimed in claim 17, where the electrode having the holes consists of a plurality of base units, in which holes are formed in a given pattern, and a hole pattern in one base unit can be rotated by 90° to be substantially identical to that in an adjacent base unit.

* * * * *